United States Patent [19]

Okumura

[11] Patent Number: 5,473,424
[45] Date of Patent: Dec. 5, 1995

[54] TILTING APPARATUS

[75] Inventor: Masahiko Okumura, Tokyo, Japan

[73] Assignee: Nikon Corporation, Tokyo, Japan

[21] Appl. No.: 363,336

[22] Filed: Dec. 23, 1994

[30] Foreign Application Priority Data

Dec. 28, 1993 [JP] Japan .................. 5-335032

[51] Int. Cl.$^6$ .................................. G03B 27/42
[52] U.S. Cl. ................ 356/139.03; 356/150; 356/400
[58] Field of Search ..................... 356/150, 139.03, 356/400, 401; 355/53

[56] References Cited

U.S. PATENT DOCUMENTS

| | | | |
|---|---|---|---|
| 4,084,903 | 4/1978 | Pircher | 355/53 |
| 4,383,757 | 5/1983 | Phillips | 355/53 |
| 4,504,144 | 3/1985 | Trost | 356/150 |
| 4,558,949 | 12/1985 | Uehara et al. | 356/152 |
| 4,583,847 | 4/1986 | Battig et al. | 355/53 |
| 4,650,983 | 3/1987 | Suwa | 250/204 |
| 4,770,531 | 9/1988 | Tanaka et al. | 356/358 |
| 4,830,500 | 5/1989 | Kuroki et al. | 356/401 |
| 5,059,789 | 10/1991 | Salcudean | 250/206.1 |
| 5,367,373 | 11/1994 | Busch-Vishniac et al. | 356/139.03 |

FOREIGN PATENT DOCUMENTS 58-103136  6/1983  Japan .

*Primary Examiner*—Mark Hellner
*Attorney, Agent, or Firm*—Shapiro and Shapiro

[57] ABSTRACT

A table holding a substrate thereon is placed on a focusing and levelling stage through three fulcrums, and a calculator receives as inputs the coordinates values of the table measured by an interferometer, the amount of positional deviation between the surface of a wafer and a predetermined fiducial plane at each of a plurality of measuring points on the substrate which is measured by a multipoint AF sensor, and a weight coefficient given to be to the amount of positional deviation at each of the plurality of measuring points, thereby calculating the residual deviation at each of the three fulcrums. A controller adopts the PID control system and controls the amounts of displacement of the three fulcrums on the basis of the residual deviation calculated by the calculator, the integrated value of this residual deviation and the differentiated value of this residual deviation.

8 Claims, 5 Drawing Sheets

TILTING APPARATUS

BACKGROUND OF THE INVENTION

1. Field of the Invention

This invention relates to a stage apparatus for correcting the inclination of a body, and particularly to a tilting apparatus capable of supporting thereon and inclining a photosensitive substrate to which the pattern of a mask is transferred, which apparatus is suitable for an exposure apparatus used in the photolithography process for manufacturing, for example, semiconductive elements, liquid crystal display elements, thin film magnetic heads, etc.

2. Related Background Art

In an exposure apparatus used in the photolithography process, the pattern of a mask or a reticle is transferred onto a photosensitive substrate (a wafer to which photoresist is applied or a glass plate or the like). In this case, the work of setting the whole or a local area of the surface of the photosensitive substrate in parallelism to a plane which is the reference, i.e., so-called levelling (tilting), is effected. For example, in the proximity system wherein a mask and a photosensitive substrate are made proximate to each other with a gap of the order of 10 μm to 300 μm, the pattern surface of the mask and the surface of the photosensitive substrate are made parallel to each other over the whole area thereof. Also, in the projection system wherein the image of the pattern of a mask or a reticle is imaged on a photosensitive substrate through a projection optical system, the image plane of the projection optical system and the surface of the photosensitive substrate are made parallel to each other.

Such levelling work is done to obtain a good quality of transfer image (the quality of pattern profile formed on the photosensitive substrate) on the whole area of the surface of the photosensitive substrate to which the pattern of the mask or reticle is transferred. Particularly, in an exposure apparatus of the projection type which is provided with a projection optical system of high numerical aperture and high resolving power, the depth of focus is markedly small as compared with the size of the projection field (image field) of the projection optical system. This depth of focus $\Delta F$ is represented as $\Delta F = \lambda/(2NA^2)$ by the wavelength $\lambda$ of illuminating light for exposure and the numerical aperture NA of the projection optical system.

Assuming here that $\lambda=365$ [nm] (the i-line of a mercury lamp) and NA=0.6, the actually effective depth of focus $\Delta F$ is about 0.5 μm (1 μm in terms of the width in the direction of the optical axis of the projection optical system) relative to the best focus position. In contrast, the size of the pattern image projected differs depending on the exposure apparatus, but is of the order of 15 mm×15 mm in a typical wafer stepper. This, when considered in terms of the thickness of a plate material of 1 m square, corresponds to only 66.7 μm. Because of such very small depth of focus, in a projection exposure apparatus, it is necessary to effect levelling accurately with the localized waviness or the like of the surface of the photosensitive substrate taken into account to thereby keep the degree of parallelism thereof to the projection image plane.

To effect such levelling, it is necessary to accurately measure the amount of inclination of the whole or a local area of the surface of the photosensitive substrate from a fiducial plane. Various measuring systems therefor have heretofore been proposed, and as typical ones of them, there are known (A) Japanese Patent Application Laid-Open No. 58-103136, (B) U.S. Pat. No. 4,084,903, (C) U.S. Pat. No. 4,558,949 and (D) U.S. Pat. No. 4,383,757.

In publication (A), there is disclosed a system in which the height position of each of a plurality of points (three or more points) on a photosensitive substrate is measured by a gap sensor such as an air micrometer and on the basis of the measured values and the coordinates value of each measuring point in XY plane, the approximate plane expression of the surface of the photosensitive substrate is specified by the least square method, whereafter the amount of deviation of the approximate plane from a fiducial plane is determined by the coordinates positions of the three drive points of a levelling mechanism for the photosensitive substrate, and the amount of deviation in the height direction at each of those drive points is corrected.

U.S. patent (B) discloses a system in which the nozzles of an air micrometer are disposed at four locations around the lower portion of the barrel of a projection optical system and two of those four nozzles are provided on the X-axis and the remaining two are provided on the Y-axis, and the distance (gap) between the surface of a photosensitive substrate and the barrel is measured by each nozzle, and the amount of inclination $\alpha_y$ of the photosensitive substrate about the Y-axis is found from the difference in back pressure between the two nozzles on the X-axis and the amount of inclination $\alpha_x$ of the photosensitive substrate about the X-axis is found from the difference in back pressure between the two nozzles on the Y-axis, and by the use of these amounts of inclination $\alpha_x$ and $\alpha_y$, a holder for the photosensitive substrate is vertically moved by three piezo elements to thereby correct the inclination.

In U.S. patent (C), there is disclosed a system in which collimated light is applied from an oblique direction to a local area on a photosensitive substrate to which a projected image by a projection optical system is transferred, and the reflected light thereof (a parallel beam of light) is imaged into a spot-like shape by a condensing lens and is received by a four-division photoelectric element, and the average amount of inclination of the local area on the photosensitive substrate is detected from a variation in the received position of the spotlight on the four-division photoelectric element.

U.S. patent (D) discloses a system in which a light spot is projected onto each of a plurality of points on a photosensitive substrate through a projection optical system, and the reflected light thereof is re-imaged through the projection optical system and from a variation in the contrast of this re-imaged image, the focus error at the projected point of each light spot on the photosensitive substrate in the direction of the optical axis of the projection optical system (Z-direction) is detected, and a holder for holding the photosensitive substrate is inclined by three drive units (servo-motors) so that the focus error may be substantially zero at each projected point.

Besides the above-described conventional techniques (A) to (D), what is necessary for levelling is the structural precision and stability of the levelling mechanism itself, and a conventional technique therefor is disclosed in U.S. patent (D). As the levelling mechanism, there is also known a system as disclosed in (E) U.S. Pat. No. 4,770,531 wherein drive points in Z-direction are provided at locations trisecting the circumference of a levelling table and at each drive point, the levelling table and the base thereof are coupled together by a doughnut-shaped leaf spring to thereby enhance the lateral rigidity of the levelling table.

There is further known in (F) U.S. Pat. No. 4,504,144 a levelling control system in which a focus error is measured at each of three points in a local area on a photosensitive substrate to which the pattern image of a mask or a reticle is transferred, and from the result of the measurement, the amounts of inclination (θx, θy) in the direction of the X-axis and the direction of the Y-axis in a field and the overall focus error amount (f) are found as analog values and by the use of the coordinates position (analog value) of a field on a wafer and the coordinates positions (analog values) of three drive points on a wafer levelling table, besides the amounts of inclination (θx, θy) and the focus error amount (f), the amount of movement of a servo-motor at each of the three drive points (the amount of correction of the drive point in Z-direction) is calculated by an analog calculation circuit.

Among the conventional techniques as described above, the levelling control system disclosed in publication (A) has suffered from the inconvenience that the heights at three or more measuring points on the photosensitive substrate are measured by the gap sensor such as an air micrometer and therefore the time required for the measurement of the heights is long and the responsiveness of the levelling operation is bad. In a control system wherein the responsiveness of the levelling operation is bad, it is difficult to apply to an exposure apparatus a scanning system particularly such as a step and scan system in which a reticle and a photosensitive substrate are synchronously scanned to thereby successively transfer the pattern images of the reticle onto the photosensitive substrate.

The levelling control system disclosed in U.S. patent (B), which uses an air micrometer, is similar to publication (A) in that the responsiveness is bad. Further, in U.S. patent (B), the angles of inclination about two axes are first calculated from the focus positions at four points and the amount of drive of the driving element is newly calculated from those angles of inclination, and this has led to the inconvenience that the calculation time becomes longer and the responsiveness becomes worse.

Also, in U.S. patent (C), only the average angle of inclination is measured and the focus position (the height) is not measured, and this has led to the inconvenience that a sensor for the detection of the focus position becomes discretely necessary and the control mechanism is complicated. In U.S. patent (D), the focus position at each point on the photosensitive substrate is measured through the projection optical system, and this leads to the possibility that this system cannot be applied to an exposure apparatus which does not use a projection optical system and that an illumination optical system or the like for applying illuminating light to the reticle becomes complicated. On the other hand, the system in which the lateral rigidity is enhanced as disclosed in U.S. patent (E) suffers from no special inconvenience.

Further, in the levelling control system disclosed in U.S. patent (F), as in U.S. patent (B), two steps of calculation in which the angles of inclination about two axes and the focus position are first calculated from the focus positions at three points and the amount of drive of the driving element is newly calculated from those angles of inclination and the focus position are effected, and this has led to the inconvenience that the calculation time becomes longer and the responsiveness becomes worse. Also, only the focus positions at three points are measured, and this leads to the inconvenience that when for example, there is a measuring point which is peculiarly high or low in the focus position, the errors of the angle of inclination of the exposed surface of the photosensitive substrate with respect to the fiducial plane and the focus position become great.

In this connection, when the pattern images of the reticle are to be transferred to each shot area of the photosensitive substrate, unevenness (level difference) is sometimes created in each shot area by the process hitherto. Patterns of various line widths are mixedly included in the pattern images of the reticle and therefore, to form a clear-cut image on the whole surface of each shot area, it is desirable that the area on the photosensitive substrate to which one of the pattern images of the reticle which is narrowest in line width is transferred be adjusted to the fiducial plane. In the conventional levelling control system, however, it has been impossible to preponderantly adjust a desired area on the photosensitive substrate to the fiducial plane.

SUMMARY OF THE INVENTION

It is the object of the present invention to provide a stage apparatus capable of adjusting the angle of inclination and/or the height position (a position in a direction perpendicular to the surface of a substrate) of a substrate in order to adjust the surface of the substrate to a fiducial plane, and particularly a stage apparatus suitable, for example, for an exposure apparatus of the step and repeat type or the step and scan type of which high responsiveness is required.

The stage apparatus according to the present invention has a table for holding a substrate thereon, a stage supporting the table thereon and two-dimensionally movable in a predetermined plane, a driving member for displacing each of the three fulcrums of the table in a direction perpendicular to the predetermined plane, a first detector for detecting the position of the table in the predetermined plane, a second detector for detecting the deviation between the surface of the substrate and a predetermined fiducial plane in the direction perpendicular to the predetermined plane at each of at least three measuring points on the substrate, a calculator for calculating any residual deviation in the direction perpendicular to the predetermined plane at each of the three fulcrums of the driving member on the basis of the results of the detection by the first and second detectors, and a controller for controlling the amounts of displacement of the three fulcrums of the driving member on the basis of the calculated residual deviation, the integrated value of this residual deviation and the differentiated value of this residual deviation. It is desirable that at this time, weights $W_1$ to $W_n$ be given to the deviation at each of at least three measuring points on the substrate and the calculator calculate the residual deviation at each of the three fulcrums of the driving member so that a residual error component calculated with those weights given to the result of the detection by the second detector may be minimum.

Now, in the calculator of the present invention, the operation of finding the residual deviation (control deviation) at each fulcrum of the driving member from the output of the second detector is based on the following principle.

Figure 2:
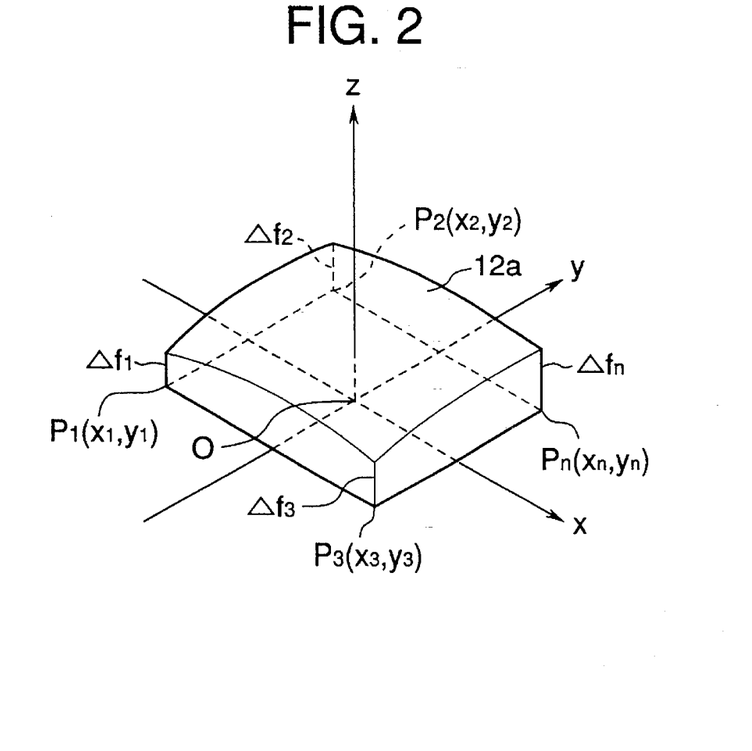
FIG. 2 is a view used for the illustration of the defocus amount of the surface of a wafer in FIG. 1 and the time plane of a projection optical system.

First, as shown in FIG. 2 of the accompanying drawings, the plane in which the substrate is moved is defined as xy plane and an axis perpendicular to this xy plane is defined as the Z-axis. The second detector (16A to 16C) is fixed to the Z-axis, the coordinates of the measuring points $P_1$ to $P_n$ thereof are defined as $(x_i, y_i)$ (i=1 to n), and the measured value by the second detector, i.e., the deviation between the surface of the substrate and the predetermined fiducial plane in the direction of the Z-axis at each measuring point $P_i$ (hereinafter referred to as the "defocus amount") is defined as $\Delta f_i$. Also, the surface of the substrate approximated, for example, by the least square method (the approximate plane) is defined by the following expression by the use of coefficients A, B and C:

$$Z = A \cdot x + B \cdot y + C \tag{1}$$

Next, the weighting by a weight coefficient $W_i$ is effected to the measured value $\Delta f_i$ at each measuring point $P_i$ and the residual error component S by the square sum of the weighting like the following expression is defined.

$$S = \sum_{i=1}^{n} W_i (\Delta f_i - A \cdot x_i - B \cdot y_i - C)^2 \tag{2}$$

Here, as a method of setting the weight coefficient $W_i$, when the present invention is applied to an exposure apparatus of the collective exposure type such as a stepper, for example, the value of the weight coefficient to a measuring point in or near the area on the substrate (wafer) to which a pattern of the narrowest line width on a mask is transferred can be made great. Also, when the present invention is applied to an exposure apparatus of the scanning exposure type, the weight coefficient $W_i$ is a function of the relative coordinates of the two-dimensional coordinates (X, Y) of the table (14) holding the substrate and the Z-axis (if there is a projection optical system, the optical axis thereof), i.e., $W_i$ (X, Y). When the weighting is not effected, $W_i$ in expression (2) can be $W_i=1$ (i=1 to n).

The values of the coefficients A, B and C which determine the approximate plane are then determined so that the residual error component S may be minimum. That is, the coefficients A, B and C are given by the following expression by the use of a matrix Q and a variable vector F (which will be described later):

$$\begin{bmatrix} A \\ B \\ C \end{bmatrix} = QF \tag{3}$$

Here, the matrix Q is a matrix of 3 columns×3 rows as shown below.

$$Q = \begin{pmatrix} q_{11}/q_0 & q_{12}/q_0 & q_{13}/q_0 \\ q_{21}/q_0 & q_{22}/q_0 & q_{23}/q_0 \\ q_{31}/q_0 & q_{32}/q_0 & q_{33}/q_0 \end{pmatrix} \tag{4}$$

The numerators $q_{11}$ to $q_{33}$ and denominator $q_o$ of the elements of this matrix are given by the following expressions by the use of the coordinates $(x_i, y_i)$ and the weight coefficient $W_i$:

$$\left.\begin{aligned}
q_{11} &= n \sum_{i=1}^{n} W_i \cdot y_i^2 - \left( \sum_{i=1}^{n} W_i \cdot y_i \right)^2 \\
q_{22} &= n \sum_{i=1}^{n} W_1 \cdot x_i^2 - \left( \sum_{i=1}^{n} W_i \cdot x_i \right)^2 \\
q_{33} &= \sum_{i=1}^{n} W_i \cdot x_i^2 \cdot \sum_{i=1}^{n} W_i \cdot y_i^2 - \left( \sum_{i=1}^{n} W_i \cdot x_i^2 \cdot \sum_{i=1}^{n} W_i \cdot y_i \right)^2 \\
q_{12} &= q_{21} = \sum_{i=1}^{n} W_1 \cdot x_i \cdot \sum_{i=1}^{n} W_i \cdot y_i - n \sum_{i=1}^{n} W_i \cdot x_i \cdot y_i \\
q_{13} &= q_{31} = \sum_{i=1}^{n} W_i \cdot x_i \cdot y_i \cdot \sum_{i=1}^{n} W_i \cdot y_i - \sum_{i=1}^{n} W_i \cdot x_i \cdot \sum_{i=1}^{n} W_i \cdot y_i^2 \\
q_{23} &= q_{32} = \sum_{i=1}^{n} W_i \cdot x_i \cdot y_i \cdot \sum_{i=1}^{n} W_i \cdot x_i - \sum_{i=1}^{n} W_i \cdot y_i \cdot \sum_{i=1}^{n} W_i \cdot x_i^2 \\
q_0 &= n \sum_{i=1}^{n} W_i \cdot x_i^2 \cdot \sum_{i=1}^{n} W_i \cdot y_i^2 - n \left( \sum_{i=1}^{n} W_i \cdot x_i \cdot y_i \right)^2 - \\
& \quad \sum_{i=1}^{n} W_i \cdot x_i^2 \cdot \left( \sum_{i=1}^{n} W_i \cdot y_i \right)^2 - \sum_{i=1}^{n} W_i \cdot y_i^2 \cdot \left( \sum_{i=1}^{n} W_i \cdot x_i \right)^2 - \\
& \quad 2 \sum_{i=1}^{n} W_i \cdot x_i \cdot y_i \cdot \sum_{i=1}^{n} W_i \cdot x_i \cdot \sum_{i=1}^{n} W_i \cdot y_i
\end{aligned}\right\} \tag{5}$$

Also, the variable vector F in expression (3) is defined by the following expression:

$$F = \begin{pmatrix} \sum_{i=1}^{n} W_i \cdot \Delta f_i \cdot x_i \\ \sum_{i=1}^{n} W_i \cdot \Delta f_i \cdot y_i \\ \sum_{i=1}^{n} W_i \cdot \Delta f_i \end{pmatrix} \tag{6}$$

Here, the coordinates $(x_i, Y_i)$ of each measuring point $P_i$ of the second detector are a constant and therefore, when as in the collective exposure system such as a stepper, the weight coefficient $W_i$ is a constant, the matrix Q is a constant matrix. On the other hand, in the case of the scanning exposure system, the weight coefficient $W_i$ is a function of the two-dimensional coordinates (X, Y) of the table and therefore, the matrix Q also is a function of the coordinates (X, Y). Also, the variable vector F is determined by the defocus amount at each measuring point $P_i$ outputted by the second detector, the coordinates position of each measuring point $P_i$ of the second detector and the weight coefficient $W_i$.

In the present invention, with the predetermined fiducial plane (e.g. the image plane of a projection optical system) as a plane of z=0, the surface of the substrate (an approximate plane) is made coincident with the fiducial plane (the plane of z=0) by the levelling operation and the focusing operation. That is, the control deviation of the three fulcrums (16A to 16C) of the drive member (15) is nothing but the distance in the direction of the Z-axis between the approximate plane of the surface of the substrate and the fiducial plane (the plane of z=0) at the position of each fulcrum and therefore, the control deviations (residual deviations) $e_1$, $e_2$ and $e_3$ at the fulcrums (16A to 16C) are given by the following expression:

$$\begin{pmatrix} e_1 \\ e_2 \\ e_3 \end{pmatrix} = \begin{pmatrix} X_1 & Y_1 & 1 \\ X_2 & Y_2 & 1 \\ X_3 & Y_3 & 1 \end{pmatrix} \begin{pmatrix} A \\ B \\ C \end{pmatrix} = RQF \quad (7)$$

Here, the matrix R is defined by the following expression:

$$R = \begin{pmatrix} X_1 & Y_1 & 1 \\ X_2 & Y_2 & 1 \\ X_3 & Y_3 & 1 \end{pmatrix} \quad (8)$$

Figure 3:
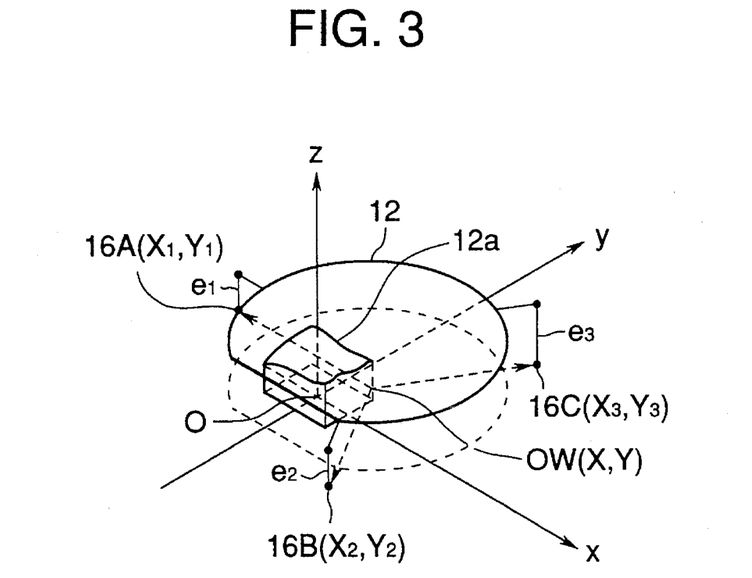
FIG. 3 is a perspective view used for the illustration of the relations among the z-axis of FIG. 1, the measuring points of a multipoint AF sensor and three fulcrums.

Here, $(X_1, Y_1)$, $(X_2, Y_2)$ and $(X_3, Y_3)$ are the coordinates positions of the three fulcrums (16A–16C) with the Z-axis (when there is a projection optical system, the optical axis thereof) as the reference, as shown in FIG. 3 of the accompanying drawings. Accordingly, the matrix R is a matrix varying with the movement of the table (14) and further, the substrate (12). That is, when the coordinates of the three fulcrums (16A to 16C) with the center OW of the substrate (12) as the reference are defined as $(X_{10}, Y_{10})$, $(X_{20}, Y_{20})$ and $(X_{30}, Y_{30})$, the matrix R of expression (8) can be expressed as follows:

$$R = \begin{pmatrix} X_1 & Y_1 & 1 \\ X_2 & Y_2 & 1 \\ X_3 & Y_3 & 1 \end{pmatrix} = \begin{pmatrix} X_{10} & Y_{10} & 1 \\ X_{20} & Y_{20} & 1 \\ X_{30} & Y_{30} & 1 \end{pmatrix} + \begin{pmatrix} X & Y & 0 \\ X & Y & 0 \\ X & Y & 0 \end{pmatrix} \quad (9)$$

Here, (X, Y) is the coordinates of the center OW of the substrate (12) with the Z-axis as the reference, and is detected by the first detectors (19X, 19Y, 20X, 20Y) for measuring the coordinates position of the table (14) in xy plane. In the manner described above, there is obtained the relation between the defocus amount $\Delta f_i$ outputted by the second detector and the control deviations of the three fulcrums (16A to 16C) of the drive member (15).

Next, drive speed command values $u_1$, $u_2$ and $u_3$ for displacing the fulcrums (16A to 16C) are found by a controller (22) so that the control deviations $e_2$, $e_2$ and $e_3$ obtained in this manner may be made zero. When the so-called PID control system which is proportion, integration and differentiation control is applied, the drive speed command values are given by the following expression by the use of integration gain $k_I$, proportion gain $k_p$ and differentiation gain $k_D$:

$$F = \begin{pmatrix} u_1 \\ u_2 \\ u_3 \end{pmatrix} = \begin{pmatrix} \int_{t0}^{t} e_1(t)dt & e_1(t) & de_1(t)/dt \\ \int_{t0}^{t} e_2(t)dt & e_2(t) & de_2(t)/dt \\ \int_{t0}^{t} e_3(t)dt & e_3(t) & de_3(t)/dt \end{pmatrix} \begin{pmatrix} k_I \\ k_P \\ k_D \end{pmatrix} \quad (10)$$

By effecting this control, the control deviations $e_1$, $e_2$ and $e_3$ can be made zero. That is, the approximate plane of the surface of the substrate (12) by expression (1) coincides with the fiducial plane of z=0. The approximate plane of the surface of the substrate (12) is determined by the weight coefficient $W_i$ and thus, if the weight coefficient $W_i$ to the measuring point $P_i$ of the second detector set within or near the area on the substrate (12) in which it is particularly desired to suppress the defocus amount small is set to a great value, optimum control therefor will be effected. Also, in the aforedescribed control, the focusing operation and the levelling operation are performed at a time without being distinguished from each other and therefore, control is effected at a high speed as compared with a case where these operations are executed continuously (time-serially). Further, the control applied here is PID control and therefore has both of the high-speed adaptability by the effect of the differentiation term and the characteristic that the steady deviation by the effect of the integration term is zero.

As described above, in the present invention, the three fulcrums of the drive member are displaced to thereby effect the levelling operation and height adjustment (focusing operation) and further, by the calculator, the residual deviation at each fulcrum is directly found from at least three deviations detected by the second detector. Thus, according to the present invention, as compared with the system for calculating the angles of rotation about the x-axis and about the y-axis and height, the calculation time is shortened and moreover, the three fulcrums are driven at a time, whereby the levelling operation and height adjustment (focusing operation) are executed at a time and therefore, the throughput of the levelling and height adjusting process is improved.

Further, in the present invention, the operation of each fulcrum is controlled by the PID control system and therefore, there can be constructed a servo-system which is excellent in the responsiveness to any change in the control target and free of steady deviation, and a high imaging performance can be obtained when the present invention is applied as the focusing and levelling stage of an exposure apparatus. Also, when a weight is given to each of the three or more measuring points of the second detector, for example, the weight of the measuring point near a desired location on the substrate is made great, whereby the height deviation (defocus amount) at that measuring point can be made small, that is, the optimization of the height deviation on the substrate becomes possible.

DESCRIPTION OF THE PREFERRED EMBODIMENT

A stage apparatus according to an embodiment of the present invention will hereinafter be described with reference to the drawings. This embodiment is one in which the present invention is applied to a stage apparatus for effecting the levelling and focusing of a wafer in a projection exposure apparatus.

Figure 4:
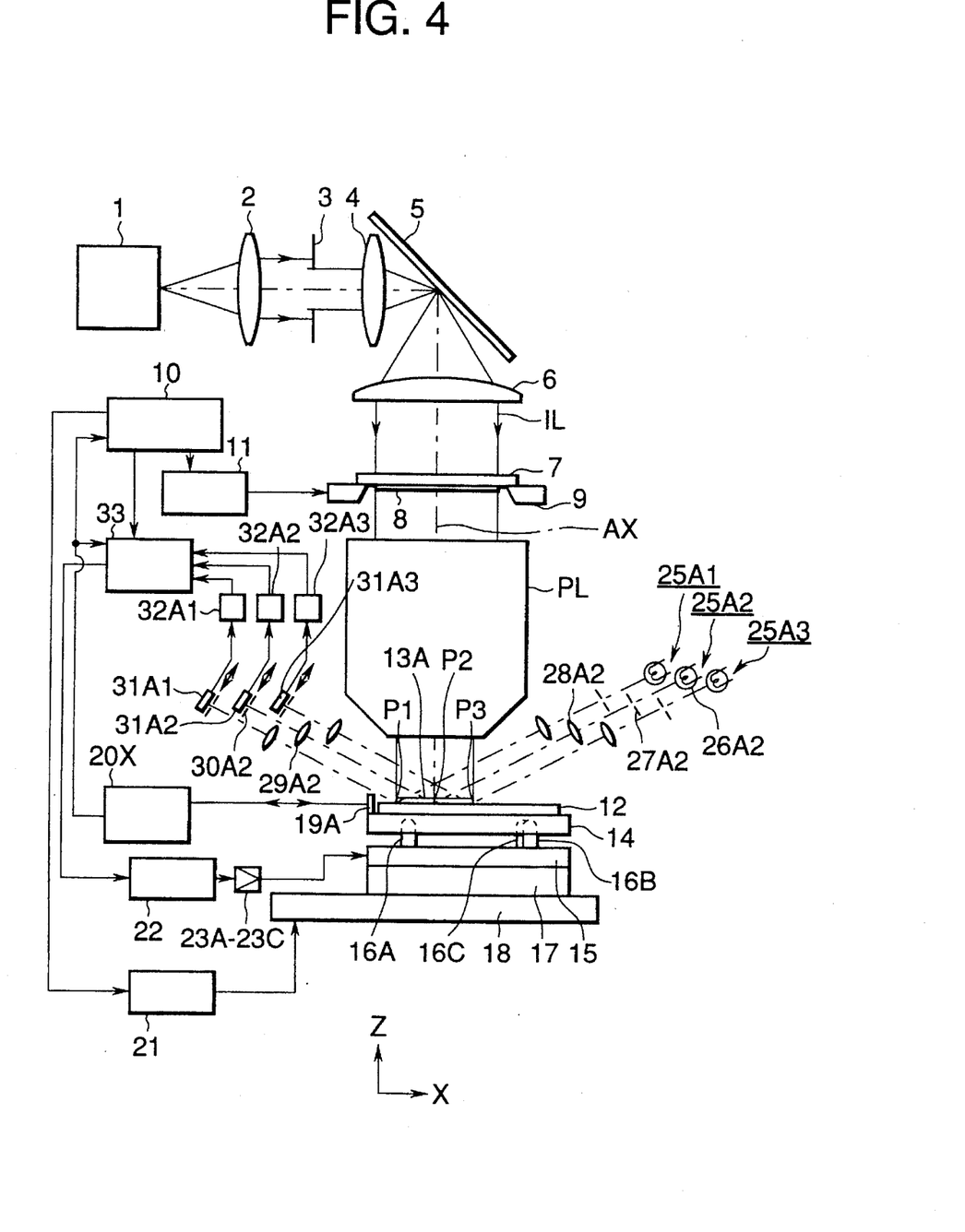
FIG. 4 shows a projection exposure apparatus to which is applied a stage apparatus according to an embodiment of the present invention.

FIG. 4 shows the construction of a projection exposure apparatus used in the present embodiment. In FIG. 4, exposure light IL emitted from an illuminating device including a light source, an optical integrator and an aperture stop or the like passes through a first relay lens 2, a reticle blind (variable field stop) 3, a second relay lens 4, a mirror 5 and a condenser lens 6 and illuminates a pattern area 8 on a reticle 7 with substantially uniform illuminance. The plane on which the reticle blind 3 is disposed is conjugate with the pattern forming surface of the reticle 7, and by varying the position and shape of an opening in the reticle blind 3, the position and shape of the illuminated area on the reticle 7 are set. As the light source in the illuminating device 1, use is made of a super-high pressure mercury lamp, an excimer laser source, a YAG laser harmonic generating device or the like.

The light passed through the pattern area 8 on the reticle 7 enters a projection optical system PL, which projects the image of a pattern in the pattern area 8 onto a shot area 13A on a wafer 12 to which photoresist is applied. The z-axis is taken in parallelism to the optical axis AX of the projection optical system PL, the x-axis is taken in a direction parallel to the plane of the drawing sheet of FIG. 4 in a two-dimensional plane perpendicular to the optical axis AX, and the y-axis is taken in a direction perpendicular to the plane of the drawing sheet of FIG. 4. The reticle 7 is held on a reticle stage 9, and a main control system 10 for generally controlling the operation of the entire apparatus effects the adjustment of the position of the reticle stage 9 through a drive system 11.

On the other hand, a wafer 12 is held on a table (wafer holder) 14, which in turn is placed on a focusing and levelling stage 15 through three fulcrums 16A to 16C movable in the direction of the z-axis. The focusing and levelling stage 15 is placed on an XY stage 17 two-dimensionally movable on a base 18. The focusing and levelling stage 15 effects the adjustment of the position (focus position) of the wafer 12 on the wafer holder 14 in Z-direction through the three fulcrums 16A to 16C and also effects the adjustment of the angle of inclination of the wafer 12. The XY stage 17 positions the focusing and levelling stage 15, the wafer holder 14 and the wafer 12 in x-direction and y-direction.

Figure 1:
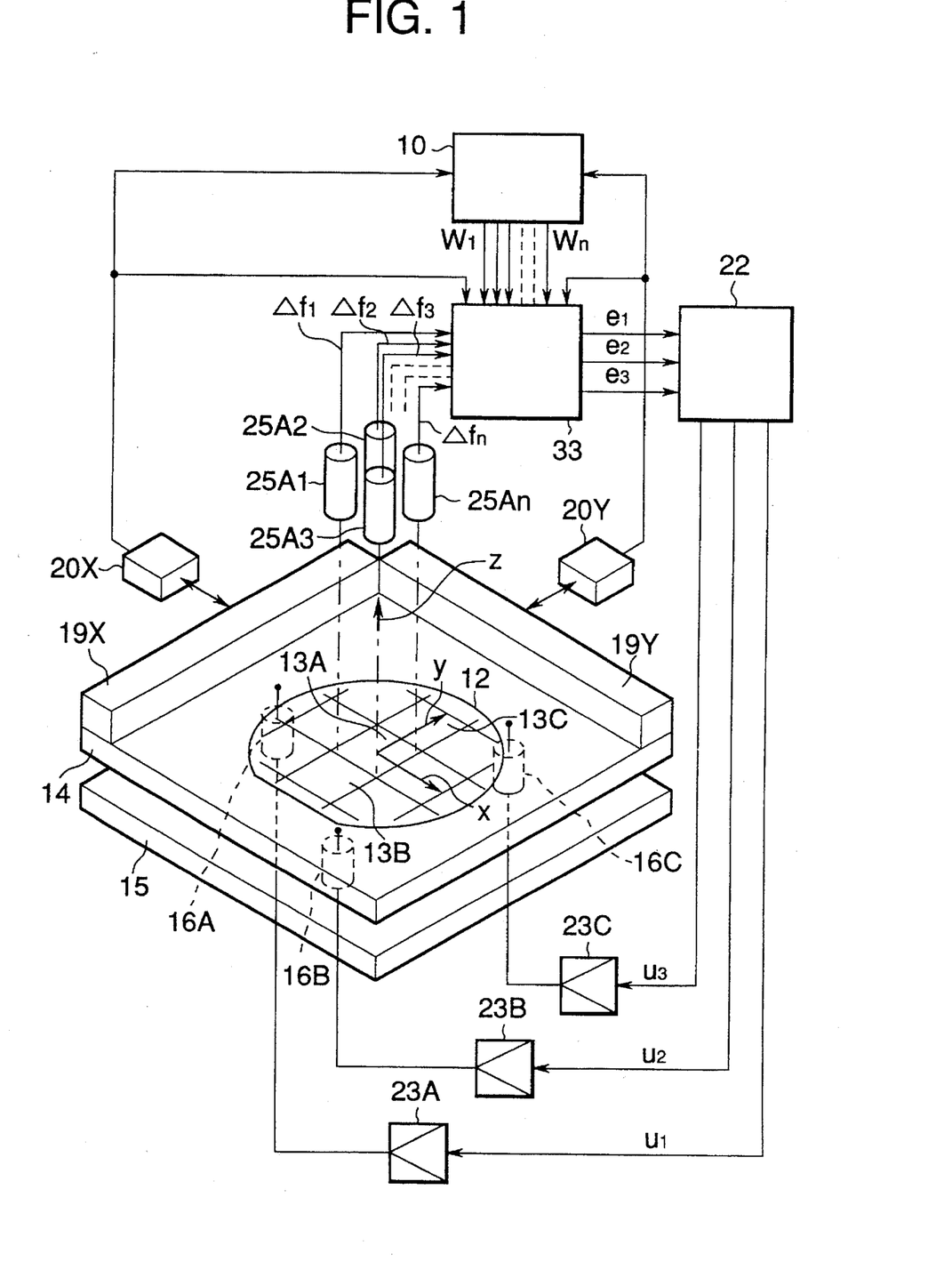
FIG. 1 schematically shows the construction of the focusing and levelling mechanism of the projection exposure apparatus of FIG. 4.

The x-coordinates of the wafer holder 14 are always monitored by a movable mirror 19X fixed to the upper end of the wafer holder 14 and a laser interferometer 20X disposed outside (for example, on the base 18), and as shown in FIG. 1, the y-coordinates of the wafer holder 14 are always monitored by a movable mirror 19Y and an outside laser interferometer 20Y, and these detected x- and y-coordinates are supplied to the main control system 10 and a plane position calculating system 33 which will be described later.

Turning back to FIG. 4, the main control system 10 controls the operation of the XY stage 17 through a drive system 21. Also, on the basis of residual deviation (control deviation) calculated by the plane position calculating system 33, a focusing and levelling control system 22 of the so-called PID (proportion, integration, differentiation) control type controls the amounts of movement of the three fulcrums 6A to 16C of the focusing and levelling stage 15 in z-direction through amplifiers 23A to 23C.

Description will now be made of the construction of a multipoint focus position detecting system (hereinafter referred to as the AF sensor) for detecting the position (focus position) of the exposed surface (e.g. the front surface) of the wafer 12 in z-direction. In the present embodiment, the number of the measuring points of the focus position on the wafer 12 by the multipoint AF sensor is nine. Accordingly, in the apparatus of FIG. 4, nine AF sensors of the same construction disclosed, for example, in U.S. Pat. Nos. 4,558, 949 and 4,650,983 are disposed as the multipoint AF sensor, but only three AF sensors 25A1, 25A2 and 25A3 on this side are shown in FIG. 4. First, in the central AF sensor 25A2, detection light non-photosensitive to photoresist which is emitted from a light source 26A2 illuminates a slit pattern on a light transmitting slit plate 27A2, and the image of the slit pattern is projected onto the central (on the optical axis AX) measuring point P2 of the shot area 13A on the wafer 12 obliquely to the optical axis AX of the projection optical system PL through an objective lens 28A2. The reflected light from the measuring point P2 is condensed on a vibration slit plate 30A2 through a condensing lens 29A2, and the image of the slit pattern projected onto the measuring point P2 is re-imaged on the vibration slit plate 30A2.

The light passed through a slit opening in the vibration slit plate 30A2 is received by a photoelectric detector 31A2, and a photoelectrically converted signal from the photoelectric detector 31A2 is supplied to an amplifier 32A2. The amplifier 32A2 synchronously detects the photoelectrically converted signal from the photoelectric detector 31A2 by the driving signal of the vibration slit plate 30A2, and amplifies the obtained signal to thereby produce a focus signal (S curve signal) varying substantially linearly within a predetermined range relative to the focus position of the surface of the wafer at the measuring point P2, and supplies this focus signal to the plane position calculating system 33.

Likewise, the AF sensor 25A1 projects the image of the slit pattern onto a measuring point P1 set on the −x-direction side (the left side as viewed in the plane of the drawing sheet) relative to the measuring point P2, and the reflected light from this measuring point P1 is received by a photoelectric detector 31A1 and a photoelectrically converted signal from the photoelectric detector 31A1 is supplied to an amplifier 32A1. The amplifier 32A1 supplies the plane position calculating system 33 with a focus signal corresponding to the focus position of the surface of the wafer at the measuring point P1. Likewise, the AF sensor 25A3 projects the image of the slit pattern onto a measuring point P3 set on the +x-direction side (the right side as viewed in the plane of the drawing sheet) relative to the measuring point P2, and the reflected light from this measuring point P3 is received by a photoelectric detector 31A3 and a photoelectrically converted signal from the photoelectric detector 31A3 is supplied to an amplifier 32A3. The amplifier 32A3 supplies the plane position calculating system 33 with a focus signal corresponding to the focus position of the surface of the wafer at the measuring point P3.

Here, the calibration of the AF sensors 25A1 to 25A3 is effected so that the intensities (voltage values) of the focus signals outputted from the amplifiers 32A1 to 32A3 may become zero when at the measuring points P1 to P3, the surface of the wafer is coincident with the imaging plane of the projection optical system PL (the surface onto which the reticle pattern is projected). Accordingly, the intensity of each focus signal corresponds to the amount of deviation in Z-direction (the direction of the optical axis AX) between the surface of the wafer and the imaging plane of the projection optical system PL at the measuring points P1 to P3. Therefore, the amount of deviation corresponding to the intensity of the focus signal obtained by the ith AF sensor 25Ai (i=1, 2, . . . , 9) can be regarded as a defocus amount $\Delta f_i$.

Figure 5:
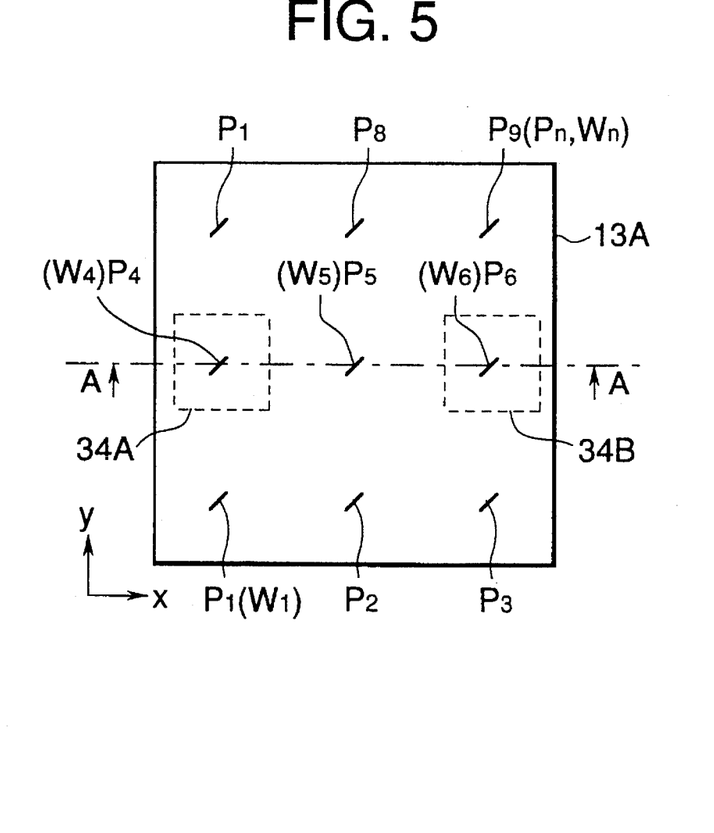
FIG. 5 shows an example of the distribution of the focus positions on the wafer by the multipoint AF sensor in FIG. 4.

FIG. 5 shows the distribution of the nine measuring points of the multipoint AF sensor in FIG. 4 on the wafer. In FIG. 5, 3×3 measuring points $P_1$ to $P_9$ are set in the shot area 13A on the wafer at a predetermined pitch in x-direction and y-direction, and the image of the slit pattern is projected by the AF sensors 25Ai (only the AF sensors 25A1 to 25A3 being shown in FIG. 4) corresponding to the respective measuring points Pi. The defocus amount $\Delta f_i$ (focus signal) of the surface of the wafer (shot area) at each measuring point Pi measured by the AF sensor 25Ai is supplied to the plane position calculating system 33 of FIG. 4.

Also, in the present embodiment, a weight coefficient Wi is allotted to the defocus amount $\Delta f_i$ at each measuring point Pi measured by the multipoint AF sensor. When for example, the line width of the pattern image of the reticle transferred to the shot area 13A is substantially equal everywhere, the values of the weight coefficients Wi may all be 1. Also, when for example, a pattern image of the narrowest line width is transferred to areas 34A and 34B surrounding the measuring points $P_4$ and $P_6$, respectively, the values of the weight coefficients $W_4$ and $W_6$ allotted to the defocus amounts at the measuring points $P_4$ and $P_6$ may be set to values greater than 1, and the value of the weight coefficient $W_5$ allotted to the defocus amount at the central measuring point $P_5$ s may be set to a value smaller than 1. It is to be understood that the values of the weight coefficients allotted to the defocus amounts at the remaining six measuring points are set to e.g. 1. Thus, even if for example, the surface of the wafer along the line A—A of FIG. 5 is wavy as exaggeratedly shown in FIG. 6, when the focusing operation and levelling operation according to the present embodiment are executed, the image plane of the projection optical system PL will be set to a plane 46B relative near to the surfaces of both of the partial areas 34A and 34B and a pattern image of the narrowest line width will be transferred with high resolution.

Figure 6:
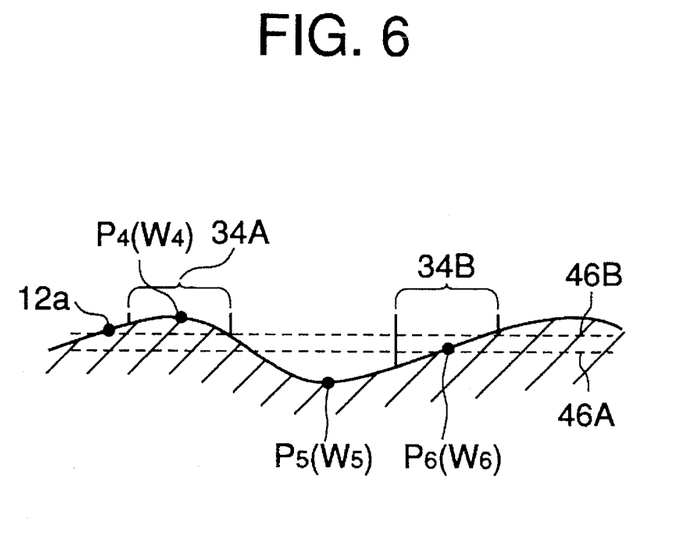
FIG. 6 is a cross-sectional view taken along the line A—A of FIG. 5.

In contrast, when in the shot area 13A having waviness as shown in FIG. 6, the values of all weight coefficients Wi are 1 in common, the image plane of the projection optical system PL is set to an average plane 46A on the whole surface of the shot area and there occurs the possibility that the pattern image of the narrowest line width transferred to the partial area 34A will be blurred. That is, as in the present embodiment, for example, the weight coefficient Wi conforming to the degree of minuteness (line width, pitch, etc.) of the pattern image is allotted to the measurement data (defocus amount) of each measuring point Pi, whereby the pattern image of the reticle can be transferred to the whole surface of the shot area 13A with high sharpness.

An example of the construction of the three fulcrums 16A to 16C of the focusing and levelling stage 15 used in the present embodiment will now be described with reference to FIG. 7.

Figure 7:
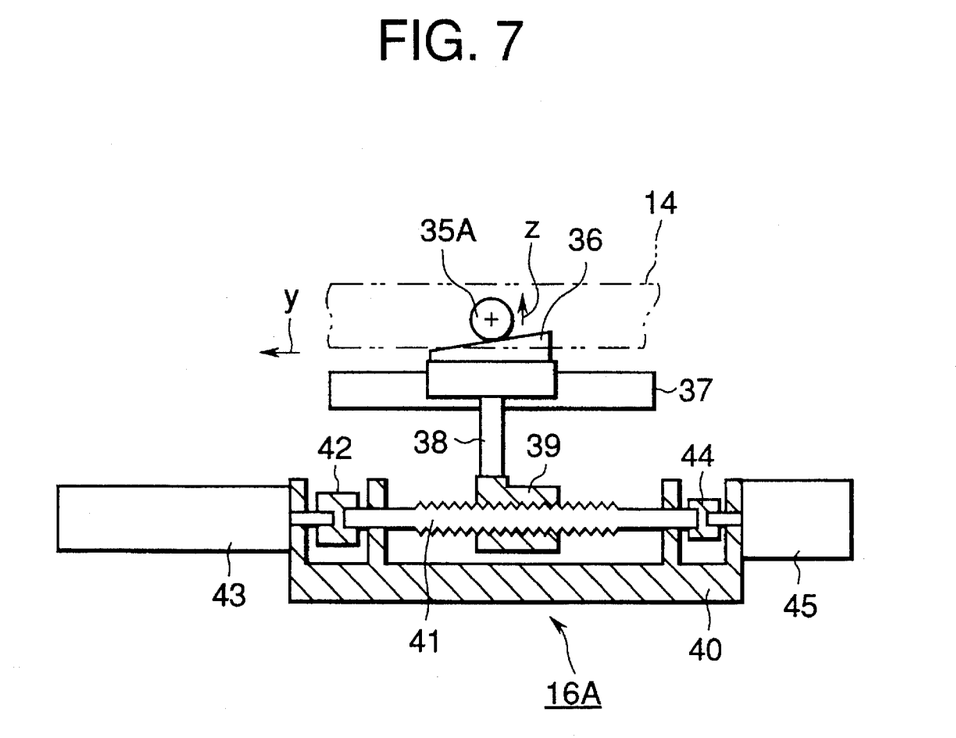
FIG. 7 shows an example of the construction of one fulcrum in FIG. 4.

FIG. 7 is a cross-sectional view of the fulcrum 16A. In FIG. 7, a housing 40 is fixed on the focusing and levelling stage 15 of FIG. 4 and a feed screw 41 is rotatably contained in the housing 40. A rotary motor 43 is connected to the left end of the feed screw 41 through a coupling 42, and a rotary encoder 45 for detecting the angle of rotation is connected to the right end of the feed screw 41 through a coupling 44. A nut 39 is threadably engaged with the feed screw 41, and an inclined surface portion 36 having an inclined upper end is fixed to the nut 39 through a strut 38, and a rotatable member 35A is in contact with the upper end of the inclined surface portion 36. The rotatable member 35A is embedded in the interior of the wafer holder 14 of FIG. 4 for rotation but against lateral movement.

Also, the inclined surface portion 36 is supported for movement along a straight guide 37 in a direction parallel to the feed screw 41. In this case, the drive speed command value from the focusing and levelling control system 22 of FIG. 4 is supplied to the rotary motor 43 through the amplifier 23A and the rotary motor 43 rotates the feed screw 41 at a designated drive speed (drive rotation angular speed). Thereby, the nut 39 is moved in y-direction along the feed screw 41 and the inclined surface portion 36 is also moved along the feed screw 41. Accordingly, the rotatable member 35A which is in contact with the upper end of the inclined surface portion 36 is displaced in a vertical direction (z-direction) relative to the housing 40 while being rotated. Also, the angle of rotation of the feed screw 43 is measured by the rotary encoder 45, whereby the amount of vertical displacement of the rotatable member 35A is detected. The other fulcrums 16B and 16C are of the same construction as described above.

The fulcrums 16A to 16C each may be comprised, for example, of a piezo element or a voice coil motor, besides the type using the rotary motor as shown in FIG. 7. Where for example, the fulcrums 16A to 16C each is comprised of a piezo element, design may be made such that not the drive speed command value but a drive command value indicative, for example, of the amount of displacement is supplied from the focusing and levelling control system 22.

An example of the focusing and levelling operations of the present embodiment will now be described with reference to FIG. 1. FIG. 1 is a view in which in the projection exposure apparatus of FIG. 4, the projection optical system PL is omitted and n AF sensors 25A1 to 25An (in the case of FIG. 5, n=9) are simplifiedly shown. In FIG. 1, by the AF sensors 25A1 to 25An, the amounts of positional deviation in z-direction between the surface of the wafer 12 and the image plane of the projection optical system PL at measuring points P to $P_n$ corresponding to the AF sensors, i.e., defocus amounts $\Delta f_1$ to $\Delta f_n$, are detected and these defocus amounts are supplied as focus signals to the plane position calculating system 33. The coordinates (X, Y) of the center of the wafer 12 measured by a laser interferometer 20X for the x-axis and a laser interferometer 20Y for the y-axis are also supplied to the plane position calculating system 33.

Also, the main control system 10 supplies the plane position calculating system 33 with weight coefficients $W_1$ to $W_n$ given to the focus positions (defocus amounts) of the surface of the wafer 12 at the measuring points $P_1$ to $P_n$ of the multipoint AF sensor. Further, the main control system 10 pre-supplies the plane position calculating system 33 with the coordinates values $(x_i, y_i)$ of n measuring points $P_i$ when the optical axis AX of the projection optical system PL is the z-axis and the coordinates values $(X_{10}, Y_{10})$, $(X_{20}, Y_{20})$ and $(X_{30}, Y_{30})$ of the three fulcrums 16A to 16C, respectively, when the center of the wafer 12 is the reference.

So, the plane position calculating system 33 finds the matrix Q from expressions (4) and (5), finds the variable vector F from expression (6), finds the matrix R from expression (9), and thereafter finds the control deviations (defocus amounts) $e_1$, $e_2$ and $e_3$ of the three fulcrums 16A to 16C, respectively, from expression (6). In this case, the weight coefficient Wi can be freely set by the operation in conformity with the process, but for example, the value of the weight coefficient Wi is made great for a partial area in which it is particularly desired to suppress the defocus amount to a small value, and conversely the value of the weight coefficient Wi is made small for a partial area in which the allowed value of the defocus amount is great. In the collective exposure system like a stepper, the weight coefficient Wi is a constant value after it is once set for a wafer 12 before the exposing operation. In contrast, in the scanning exposure system, the relative positional relations between the measuring points $P_1$ to $P_n$ of the multipoint AF sensors 25A1 to 25An and the shot area vary during scanning exposure and therefore, the weight coefficient Wi varies in conformity with the position of the XY stage 17.

Now, the control deviations $e_1$, $e_2$ and $e_3$ calculated by the plane position calculating system 33 are supplied to the focusing and levelling control system 22 of the PID control type, in which the drive speed command values $u_1$, $u_2$ and $u_3$ of the respective rotary motors (for example, the rotary motor 43 of FIG. 7) in the three fulcrums 16A to 16C are found in accordance with expression (10). At this time, the integration gain $k_I$, proportion gain $k_P$ and differentiation gain $k_D$ of expression (10) are preset to predetermined values. The drive speed command values $u_1$, $u_2$ and $u_3$ are supplied to the respective rotary motors in the fulcrums 16A, 16B and 16C through the amplifiers 23A, 23B and 23C, respectively.

By the above-described control system being operated, the surface of the shot area 13A on the wafer 12 coincides with the image plane of the projection optical system PL over the whole thereof, that is, the whole surface of the shot area 13A is set within the depth of focus of the projection optical system PL and thus, the focusing and levelling operations are terminated. Thereafter, the pattern image of the reticle 7 is transferred to the shot area 13A, whereafter the pattern image of the reticle 7 is also transferred, for example, to the shot areas 13B, 13C, . . . after the focusing and levelling operations are performed.

As described above, in the present embodiment, the control deviations of the fulcrums 16A to 16C are directly calculated from the defocus amounts measured by the AF sensors 25A1 to 25An and therefore, the calculation time is shortened. Accordingly, even when a high response speed is required as in the scanning exposure system, focusing and levelling can be effected highly accurately, following the scanning of the XY stage 17. Further, by the use of the weight coefficient Wi, the desired partial area in the shot area on the wafer 12 can be preponderantly adjusted into the image plane of the projection optical system PL and therefore, even when level differences, waviness or the like is created on the exposed surface of the wafer 12, the pattern image of the reticle can be exposed onto the whole surface of the shot area with high sharpness.

In the above-described embodiment, n AF sensors are combined to construct a multipoint AF sensor, but use may be made of a multipoint AF sensor as disclosed, for example, in Applicant's U.S. patent application Ser. No. 003,451 (Jan. 12, 1993) wherein a slit plate having a plurality of opening is disposed in a light transmitting system and a plurality of slit pattern images are projected onto a wafer and the reflected light from the wafer is condensed to thereby re-image a plurality of slit pattern images and the pattern images are photoelectrically detected independently of one another. Also, the above-described embodiment is one in which the present invention is applied to an exposure apparatus having a projection optical system, but the stage apparatus of the present invention can also be applied as a stage for the height adjustment and levelling of an exposure apparatus, for example, of the proximity type which does not use a projection optical system. Thus, the present invention is not restricted to the above-described embodiment, but can assume various constructions without departing from the gist of the invention.

What is claimed:

1. An apparatus for adjusting the inclination of a substrate comprising:

a table for holding said substrate thereon;

a stage for supporting said table thereon and two-dimensionally movable in a predetermined plane;

a drive member for displacing each of three fulcrums supporting said table in a direction perpendicular to said predetermined plane;

a first detector for detecting the position of said table in said predetermined plane;

a second detector for detecting the deviation in the direction perpendicular to said predetermined plane between the surface of said substrate and a predetermined fiducial plane at each of at least three measuring points on said substrate;

a calculator for calculating the residual deviation in the direction perpendicular to said predetermined plane at each of said three fulcrums on the basis of the results of the detection by said first and second detectors; and a controller for controlling the amounts of displacement of said three fulcrums on the basis of said calculated residual deviation, the integrated value of said residual deviation and the differentiated value of said residual deviation.

2. An apparatus according to claim 1, wherein said table includes a mirror having two reflecting surfaces orthogonal to each other, and said first detector comprises a light wave interferometer for projecting a beam of light onto each of said two reflecting surfaces.

3. An apparatus according to claim 1, wherein said second detector comprises a sensor which applies a beam of light to each of a plurality of measuring points on said substrate and receives light reflected by said substrate and outputs a photoelectric signal conforming to said deviation.

4. An apparatus according to claim 1, wherein said controller generates a weight to be given to the deviation at each of said at least three measuring points on said substrate measured by said second detector, and said calculator calculates the residual deviation of each of said three fulcrums by the use of said weighted deviation.

5. An apparatus according to claim 1, wherein said table holds a photosensitive substrate thereon, and said apparatus further comprises a projection optical system for projecting the image of a pattern on a mask onto said photosensitive substrate.

6. An apparatus according to claim 5, wherein said second detector comprises a sensor which applies a beam of light onto said photosensitive substrate and also receives the reflected light from said substrate to thereby detect the deviation in the direction of the optical axis of said projection optical system between the image plane of said projection optical system and the surface of said photosensitive substrate, and said controller controls the amount of displacement of each of said three fulcrums to thereby make the image plane of said projection optical system and the surface of said photosensitive substrate coincident with each other.

7. An apparatus for adjusting the inclination of a body comprising:

a table for holding said body thereon;

a stage for supporting said table thereon and two-dimensionally movable in a predetermined plane;

a first detector for detecting the position of said table in said predetermined plane;

a second detector for detecting the deviation in a direction perpendicular to said predetermined plane between the surface of said body and a predetermined fiducial plane at each of at least three measuring points on said body;

a calculator for calculating the residual deviation in the direction perpendicular to said predetermined plane at each of said three fulcrums on the basis of the results of the detection by said first and second detectors; and a driving device for displacing each of three fulcrums supporting said table in the direction perpendicular to said predetermined plane on the basis of said calculated residual deviation, the integrated value of said residual deviation and the differentiated value of said residual deviation.

8. An apparatus for adjusting the inclination of a body comprising:

a table for holding said body thereon;

a stage for supporting said table thereon and two-dimensionally movable in a predetermined plane;

a first detector for detecting the position of said table in said predetermined plane;

a second detector for detecting the deviation in a direction perpendicular to said predetermined plane between the surface of said body and a predetermined fiducial plane at each of at least three measuring points on said body; and a driving device for displacing each of three fulcrums supporting said table in the direction perpendicular to said predetermined plane on the basis of the residual deviation in the direction perpendicular to said predetermined plane at each of said three fulcrums which is determined from the results of the detection by said first and second detectors, the integrated value of said residual deviation and the differentiated value of said residual deviation.

* * * * *